United States Patent

Card, Jr. et al.

[15] 3,684,817

[45] Aug. 15, 1972

[54] ELECTRONIC MODULE AND CAP THEREFOR

[72] Inventors: Charles E. Card, Jr., Philmont; Daniel J. Donovan; William G. Sweeney, both of Hopewell Junction, all of N.Y.

[73] Assignee: Cogar Corporation, Wappingers Falls, N.Y.

[22] Filed: March 4, 1971

[21] Appl. No.: 120,908

[52] U.S. Cl. ..........174/52 R, 174/50.52, 174/138 G, 220/60 R, 317/101 C

[51] Int. Cl. ..............................................H05k 5/03

[58] Field of Search .174/DIG. 3, 16 R, 50.51, 50.52, 174/52 R, 52 S, 66, 138 R, 138 F, 138 G; 220/60 R; 317/101 A, 101 C, 101 CC, 101 DH, 234 G, 234 H; 338/315, 317; 339/17 C, 17 CF

[56] References Cited

UNITED STATES PATENTS

| | | | |
|---|---|---|---|
| 3,331,912 | 7/1967 | Stricker et al. | 174/50.52 |
| 3,340,438 | 9/1967 | Dion et al. | 317/101 A |
| 3,541,230 | 11/1970 | Kramer | 174/52 R X |
| 3,575,546 | 4/1971 | Liautaud | 174/50.52 |

*Primary Examiner*—Laramie E. Askin
*Attorney*—Gottlieb, Rackman & Reisman and Harry M. Weiss

[57] ABSTRACT

A cap is provided for an electronic module adapted to be mounted on a circuit board. The cap includes a skirt for surrounding a substrate which carries a number of elongated pins. Feet project from the skirt so that the substrate will be spaced from the circuit board. A number of internal ramps are carried by the feet and snap into place underneath the substrate to thereby retain the substrate within the cap, yet permit the substrate to be removed from the cap when desired.

1 Claim, 8 Drawing Figures

INVENTORS
CHARLES E. CARD JR.
DANIEL J. DONOVAN
WILLIAM G. SWEENEY

BY Gottlieb, Rackman & Reisman
Harry M Weiss
ATTORNEYS

ELECTRONIC MODULE AND CAP THEREFOR

The present application relates to covers for electrical components, and specifically to caps for integrated circuit modules.

Integrated circuit modules are understood in the art to include a substrate of inert material and a micro-circuit chip carried by the substrate. A number of elongated conductive pins are mechanically connected to and extend from the substrate, and are electrically connected to the chip. A cap ensheathes the substrate, and in this form, the module is adapted to be mounted on a printed circuit board.

The cap of the module must serve several different functions. First, it must act as the cover for the substrate in order to protect the micro-circuit chip from contact with other objects, which might harm it both physically and electrically.

Another function of the cap is to keep the substrate some distance away from the circuit board on which the module is mounted. This enables the pins of the module to be soldered to the circuit board without harm to the chip or to the substrate. Further, the distance between the substrate and the circuit board enables ventilation of both the circuit board and the module separately, which is desirable.

Still another requirement of the cap is that it have a configuration such that the module can slide with a minimum amount of friction into or out of a track of a component handling tray, which is configured to accept large numbers of such modules. The cap must be modest in cost as compared to the other components of the module, must be mass producible and of relatively simple configuration to desirably be able to be produced by injection molding.

The cap should also be readily engageable with the substrate, in a manner that can be carried out simply and without requiring the use of complex metal-working machinery. Moreover, the cap should be disengageable from the substrate so that repairs may be made to the module as required. This disengagement should be of a nature such that it will not happen accidentally, but can be carried out only deliberately by a worker.

Other manufacturers of integrated circuit modules have not provided a cap which adequately meets all of the foregoing requirements. For example, in U.S. Pat. Nos. 3,331,912 and 3,340,438 there is shown a cap for an electronic module which also serves to cover a substrate on which a micro-circuit is mounted. However, after the cap is placed over the substrate, the cover is crimped into the substrate to form a permanent connection between the cover and the substrate. Obviously, this crimping requires a separate mechanical step and involves the use of additional machinery. Moreover, it would be quite difficult if not impossible to remove the cover from the substrate, without harming either the cover or the substrate itself. Further, the cap of these patents in order to space the module from the circuit board on which the cap is mounted, has standoffs formed on the pins. Again, this requires an additional process to be carried out on the pins themselves, which because of their relatively small diameter are easily misaligned during this operation. Any misalignment of pins will prevent the pins from entering into the via holes in the circuit board, and again repair is required.

To overcome the mentioned deficiency of the prior art and to meet the requirements of a cap as mentioned above, the present invention proposes a cap which comprises a top wall and an encircling skirt, the skirt comprising four skirt panels. Four feet project from the skirt in the direction of the pins with each foot being centered on a different skirt panel. The feet are of "V"-shaped configuration. Each foot on its interior face carries an inwardly and upwardly inclined ramp. The cap itself is formed from a resilient plastic material. When the cap is mated with a substrate, the substrate fits within the feet and engages the ramps, and as continued pressure is exerted, pushes the ramps slightly out of the way until they are passed. The ramps then snap back into place, retaining the substrate within the cap. When the module, with its cap ensheathing a substrate, is mounted on a circuit board, the tips of the cap feet contact the circuit board, providing the desired spacing between the substrate and the circuit board, while leaving enough space between the substrate and the circuit board for ventilation purposes. The feet with their ramps may also be bent outwardly to disengage the cap from the substrate.

Additional objects, features and advantages of the invention will become apparent when considered in connection with a presently preferred but nonetheless illustrative embodiment of the invention, when taken in conjunction with the accompanying drawings, wherein.

Figure 1:
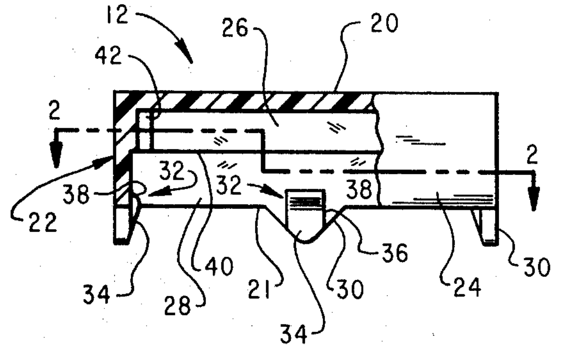
FIG. 1 is a side elevational view of the module cap with portions thereof broken away to show the interior thereof.

Referring now in detail to the drawings, there is shown an electronic component, namely an integrated circuit module 10 which, as is known in the art, includes as its basic components, a cap 12, a ceramic substrate 14 usually square in plan, a micro-circuit chip 16 (see FIG. 4) and a number of parallel elongated electrically conductive pins 18 which are mechanically fixed to the substrate 14 and which are electrically connected to the micro-circuit 16. The term "micro-circuit" as used in this application includes chips and other circuit elements of the type carried within modules. The micro-circuit 16 is preferably covered with a sealant such as the conformal non-stress coating manufactured and sold by the Dow Corning Corporation under the trademark "Sylgard." Such sealants as well as the structures of electronic modules generally are discussed in further detail in the aforesaid U.S. Pat. Nos. 3,331,912 and 3,340,438.

Figure 2:
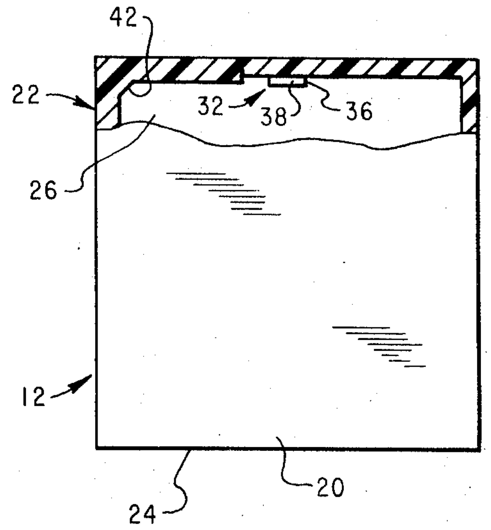
FIG. 2 is a top plan view of the module cap again with portions broken away generally along the line 2—2 of FIG. 1 to reveal the interior thereof.
Figure 3:
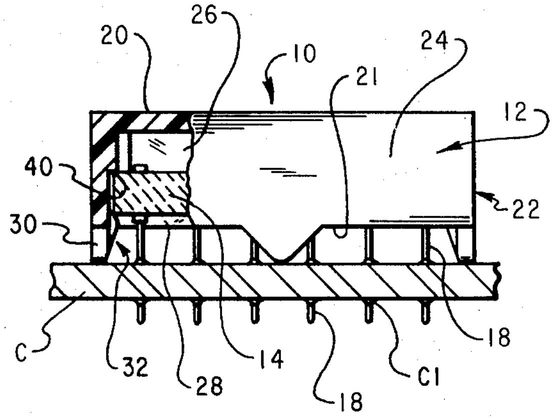
FIG. 3 is a cross-sectional view of the cap with a substrate carrying pins received therein, mounted on a circuit board.

Referring now in detail to the module cap 12, the same is generally rectangular and desirably square in top plan, as seen in FIG. 2, and includes a flat top wall 20. Attached to the top wall 20 and projecting at right angles thereto is a depending skirt 22. The skirt is comprised of four substantially identical skirt panels 24 which are joined at their side edges to one another and at their top edges to the top wall 20. The skirt 22 and the top wall 20 both combine to form an interior cavity 26 within the module which, as will be seen, is intended to receive and surround the substrate 14. The continuous lower edge 21 of the skirt 22 is a uniform distance from the upper face of the top wall 20 so that the skirt 22 is of uniform width throughout its entire extent. The lower edge 21 of the skirt 22 forms an entrance way 28 into the cavity 26 in the module. The module 10 is intended to be mounted on a circuit board C, as shown in FIG. 3, and this is usually done by passing the protruding ends of the pins 18 through pre-formed via holes in the circuit board C, and then soldering the pins in place as at $C_1$.

The cap of the present invention includes one and desirably several projections running from the cap to the circuit board, for the purpose of spacing the substrate 14 within the cap from the circuit board. More specifically, the projections comprise feet 30 which project downwardly from the skirt and toward the circuit board, in a direction parallel to the pins 18. Each skirt panel 24 has such a foot 30 extending therefrom, the feet being centered on their respective skirt panels 24 and being of substantially identical configuration. When seen in cross-section, each of the feet 30 is in the same plane with and is integral with the skirt panel 24 from which it projects. Further, each of the feet 30 is of "V"-shaped configuration, with the broad upper end of each foot joining the lower edge 21 of the skirt 22, and the lowermost tip end of the "V" being most distant from the top wall 20.

The module cap further includes an inwardly directed projection carried by the skirt 22 for retaining the substrate 12 within the cavity 26 of the cap 12. More specifically, each such projection comprises a ramp 32, each ramp being carried by a foot 30 on the interior face of such foot. Each ramp is identical in configuration and includes an upwardly and inwardly inclined camming wall 34, a pair of side walls 36 each on a different side of the camming wall 34, and an upwardly and outwardly inclined retaining wall 38. The inner end of wall 38 starts at a point slightly higher than the lower edge 21 of the skirt 22, so that as will be seen the bottom face of the substrate 14 is completely covered by the skirt 22. The distance between any two opposed ramps 32, at their inwardmost point, this being the point at which the camming wall 34 meets the retaining wall 38, is less than the distance between any opposed pair of side panels 24, and the first-named distance is also less than any side dimension of a substrate 14 to be coupled with the cap 12.

The interior of the cap 12 also includes a shoulder 40 which is formed by a ridge on the interior face of the skirt 22, the ridge running continuously along all four of the skirt panels at a constant distance from the top wall 20. The cap has fillets 42 at the junctions of the skirt panels, above the ridge 40.

The cap 12 as a whole is formed integrally of a resilient, pliant yet self-form-maintaining material and desirably the cap is molded from an inert plastic such as "Zytel 101," which is a nylon resin marketed by Du-Pont de Nemours, Wilmington, Delaware. Since the cap is manufactured from the above material, the feet 30 with their ramps 32 thereon may be flexed outwardly. The feet upon release will return to their normal positions.

Figure 5:
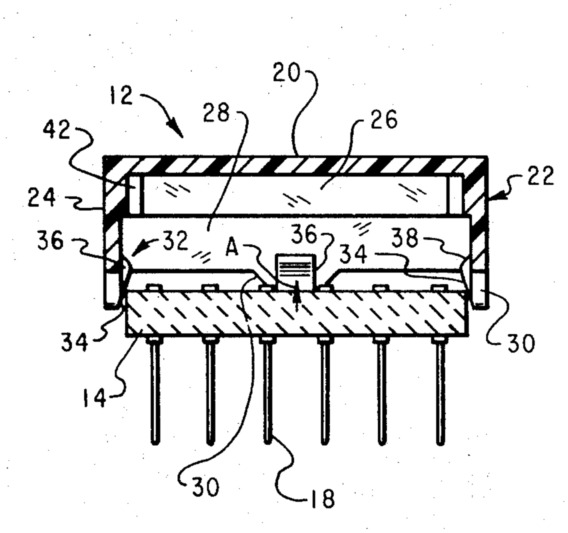
FIG. 5 is a view showing the beginning of the entry of the substrate with its pins into a cap.
Figure 6:
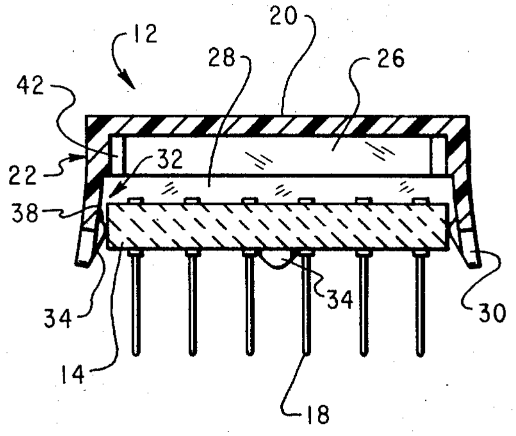
FIG. 6 is a view similar to FIG. 5 but showing the substrate in the mid portion of its entry into a cap.
Figure 7:
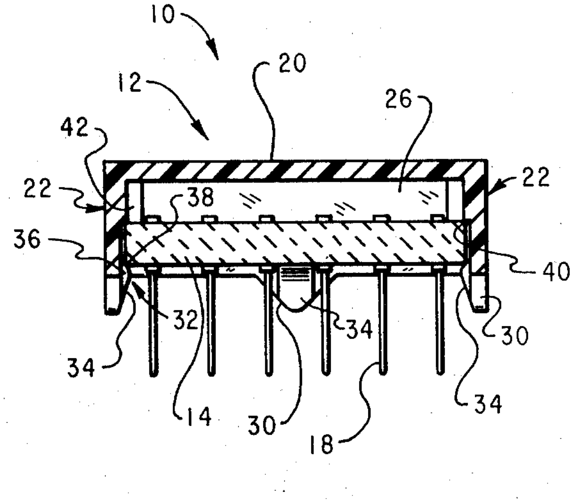
FIG. 7 is a view similar to FIG. 5 but showing the substrate fully received in the cap.

For a further understanding of the present invention, reference should now be had to FIGS. 5, 6 and 7. Theses figures show the steps of engaging a substrate 14, carrying a micro-circuit 16 and pins 18, with a cap 12. Specifically, the substrate 14 is first centered between the lower portions of the ramps 32, and relative movement in the direction indicated by the arrow A in FIG. 5 is effected until the upper edges of the substrate engage the ramps 32 at their camming walls 34. Further movement of the substrate relative to the cap will cause the ramps 32 and the feet 30 to which they are attached, to flex outwardly, such movement being possible without destruction of the cap or the substrate since the cap is made of a resilient pliable material. The feet 30 as well as the ramps 32 will move outwardly to an extent until the substrate 14 engages the ramps at their most inwardly directed points, which point is the junctions of the camming walls 34 and the retaining walls 38, as seen in FIG. 6.

Further movement of the substrate 14 relative to the cap 12 causes the substrate to abut the shoulder 40. When the substrate has reached this point of contact, the lower edges of the substrate will have cleared the camming wall 34 of the ramp and will be adjacent to the top wall 38 thereof. This clearance of the camming wall 34 enables the feet 30 and the ramps 32 to snap back into position so that, as seen in FIG. 7, the substrate abuts on its upper edge to the shoulder 40 and abuts on its lower edge the retaining wall 38 and is, in effect, wedged between these members. Thereby, the substrate is secured within the cap in the cavity 26. Additional movement of the substrate into the cavity 26 is restricted by the aforesaid abutment. The fillets 42 insure that the substrate will not pass by the shoulder 40 and further up into the cavity.

When the module is mounted on a circuit board C, see FIG. 3, the pins 18 will pass through via holes in such circuit board and the pins will be soldered in place, according to well-known procedures. The tips of the feet 30 contact the circuit board, thereby spacing the substrate 14 and its micro-circuit 16 away from the circuit board. The existence of the large openings in the cap between the feet 30 enables ventilation of the circuit board C and the substrate 14 in the area of mounting so that the module can be adequately cooled. These large openings in the cap between the feet 30 permit the solder joints between the module and the circuit board to be, for corrosion prevention, cleaned after solder joining between the module and the circuit board.

Although a secure attachment has been obtained between the substrate 14 with its pins 18 and the cap 12, it is possible when necessitated by repair requirements, for the cap 12 to be removed from the substrate 14. This can be done by simply manually bending all four of the feet 30 and thus the ramps 32 sufficiently outwardly to permit the substrate 14 to pass by the ramps and drop away from the cap. It will be apparent that the aforesaid removal of the substrate 14 from the cap 12 can be carried out without any harm to the substrate or to the cap itself.

A further advantage of the foregoing structure exists in cases where, due to manufacturing tolerances, the substrate 14 is of a width and length of slightly varying dimensions. The inward protrusions of the ramps 32 insure that the substrate will be securely captured within the cap 12, even if the substrate is of slightly reduced dimension.

It will also be noted that the joining of the cap to the substrate can be carried out quickly and easily, without requiring elaborate metal-forming or metal-working machinery of any type. All that is required is that the substrate 14 be forced towards the cap under modest pressure, until the parts snap into attachment. The disengagement of the substrate from the cap may be carried out when so required deliberately, but cannot happen accidentally.

Figure 4:
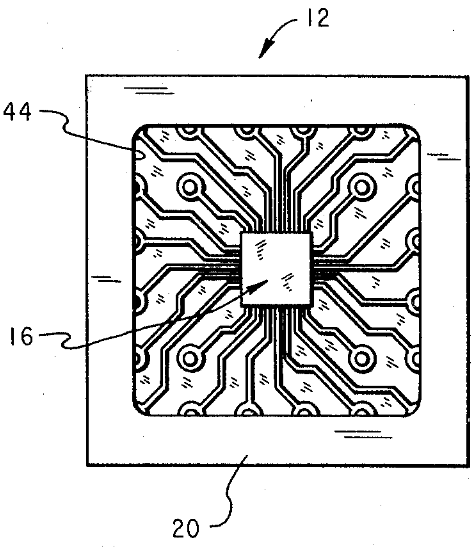
FIG. 4 is a top plan view with the module cap opened up to show the chip and conductive land pattern on the module.

In FIG. 4 the cap is shown cut away at 44 to depict the conductive land pattern on the module and the semiconductor microcircuit chip 16.

Figure 8:
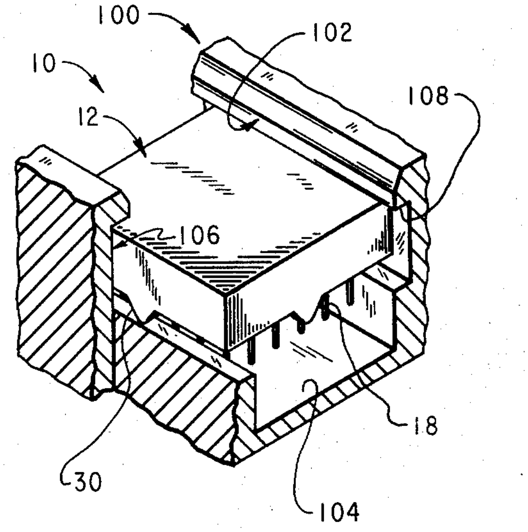
FIG. 8 shows a module sliding in a module handling tray.

FIG. 8 illustrates the utilization of the module 12 in connection with an electric-component handling tray 100. The tray has a track 102 which includes a bottom wall 104 and a pair of side walls 106, each with a groove 108 therein. When the module is in the track 102, two opposed module cap feet 30 slide in the grooves, while preventing the pins 18 from contacting any portion of the tray or dragging on the floor 104. The tips of the feet enable the module to slide in the track with little friction.

A latitude of modification, change and substitution is intended in the foregoing disclosure and in some instances some features of the invention will be employed without a corresponding use of other features. Accordingly, it is appropriate that the appended claims be construed broadly and in a manner consistent with the spirit and scope of the invention herein.

What is claimed is:

1. An electronic module for mounting on a circuit board comprising a substrate, a micro-circuit carried by the substrate, a plurality of pins extending from the substrate, and a rectangular cap ensheathing the substrate, said cap including a four-sided skirt of substantially uniform width surrounding the substrate and an equal-size "V"-shaped foot extending from each side of the skirt in the direction of said pins.

* * * * *